United States Patent [19]

Grewal et al.

[11] Patent Number: 5,723,381
[45] Date of Patent: Mar. 3, 1998

[54] FORMATION OF SELF-ALIGNED OVERLAPPING BITLINE CONTACTS WITH SACRIFICIAL POLYSILICON FILL-IN STUD

[75] Inventors: Virinder Grewal, Fishkill; Bernhard Poschenrieder, Poughkeepsie, both of N.Y.

[73] Assignee: Siemens Aktiengesellschaft, Munich, Germany

[21] Appl. No.: 534,776

[22] Filed: Sep. 27, 1995

[51] Int. Cl.⁶ .................................. H01L 21/4763
[52] U.S. Cl. ..................... 438/633; 437/631; 437/639; 437/692
[58] Field of Search ................. 437/52, 48, 919, 437/47; 438/690, 691, 692, 759, 631, 633, 639

[56] References Cited

U.S. PATENT DOCUMENTS 5,158,898  10/1992  Hayden et al. ................. 437/21

Primary Examiner—Tuan H. Nguyen
Attorney, Agent, or Firm—Donald B. Paschburg

[57] ABSTRACT

A method of forming a self-aligned overlapping bitline contact, includes steps of first depositing a sacrificial polysilicon on a spacer dielectric film, and thereafter patterning the polysilicon. The polysilicon film is a sacrificial fill-in for a bitline contact stud. The method further includes depositing a middle-of-line (MOL) oxide on the polysilicon, and planarizing the MOL oxide by chemical-mechanical polishing (CMP). Thereafter, the polysilicon is etched and the spacer dielectric film is etched to form a self-aligned bitline contact.

17 Claims, 3 Drawing Sheets

5,723,381

FORMATION OF SELF-ALIGNED OVERLAPPING BITLINE CONTACTS WITH SACRIFICIAL POLYSILICON FILL-IN STUD

BACKGROUND OF THE INVENTION

1. Field of the Invention

The present invention generally relates to a method of forming a semiconductor device, and more particularly to a method of forming self-aligned overlapping bitline contacts of a semiconductor device utilizing a sacrificial polysilicon fill-in stud.

2. Description of the Related Art

Generally, the area (e.g., chip real estate) occupied by a unit cell decreases as the integration of a semiconductor device increases. Thus, to reduce the area occupied by a cell, the width of a wordline and a bitline and the space between the word and bit lines must be reduced. In highly integrated devices, maximum permissible line space is very small, which makes the manufacturing process of a bit line contact or a contact for a storage node using direct contact methods, relatively difficult.

As a result, a self-aligned contact method is typically employed in the conventional processes. However, the etching process in the conventional method becomes difficult since the aspect ratio increases dramatically during a contact etching process as integration of the device increases.

Specifically, in a self-aligned contact method, bitline contacts are typically formed by depositing insulating spacer nitride and middle-of-line (MOL) oxide over a gate stack having a spacer therearound.

In the conventional method, these two layers must be etched independently. As a result, oxide underetch must be dealt with during wet etching or with insufficient oxide:nitride selectivity during reactive ion etching (RIE). Such independent etching is inefficient and has disadvantages as discussed below.

For example, in dynamic random access memory (DRAM) devices with small dimensions (e.g., a 0.25 μm groundrule 256-Mbit DRAM), contacts to the silicon bulk (e.g., bitline contacts) are placed between two wordlines as overlapping contacts. Obviously, an insulating film is positioned between the gate polysilicon which forms the wordline and the bitline contact.

A problem arises in that oftentimes the insulating film has "leaks" (e.g., has breaks therein or "thin" spots) which cause shorts between the wordline and bitline. Another problem is that oftentimes the insulating film is not completely etched which causes bitline "opens".

In an attempt to overcome these problems, the conventional methods typically form the bitline contacts by depositing insulating $Si_3N_4$ and $SiO_2$ layers over the spacer gate stack. Thereafter, a masked etching of these isolation layers is performed in the area where the bitline contact is supposed to be. Conventionally, the relatively thick middle-of-line (MOL) oxide layer is wet etched with a stop on the relatively thin nitride layer. For anisotropic reasons, the MOL oxide has to be dry etched selectively to nitride. In a second etch, the nitride is spacer etched. Finally, the contact hole is filled with polysilicon or another conductive layer (e.g., W).

Especially during the selective dry etching of the oxide layer, the underlying nitride layer is etched through on critical positions. Thus, the gate polysilicon lies open and the bitline contact polysilicon is subsequently also deposited directly on these certain spots.

As a result, shorts occur between the wordline and the bitline, as mentioned above. If the etching time is shortened to avoid these etch-through spots, there is a risk of a relatively thick remaining oxide film. Thus, in the subsequent etching step, the nitride layer cannot be etched through and thus the bitline opens occur. Thus, the SiN etch stop process is disadvantageous.

Other problems of the conventional techniques is that silicon nitride ($Si_3N_4$) used as a spacer dielectric film acts as a diffusion barrier for hydrogen ($H_2$). Hydrogen is able to saturate interface states and traps. If these interface states are saturated, the chip is more stable and has a higher data safety. Thus, a diffusion barrier as provided by the silicon nitride is undesirable. Further, silicon nitride ($Si_3N_4$) used as a spacer dielectric film shows higher mechanical stress. This higher mechanical stress leads to cracks and dislocations. Dislocations make the chip less stable, and the retention time is decreased.

Due to the relatively higher dielectric constant of silicon nitride (as compared to, for example, silicon oxide), the (parasitic) interlevel capacitance (Bitline-to-Bitline (BL—BL) and Bitline-to-Wordline (BL-WL)) is relatively higher for silicon nitride.

SUMMARY OF THE INVENTION

It is therefore an object of the present invention to overcome the above problems of the conventional methods.

Another object of the present invention is to provide a method of forming self-aligned overlapping bitline contacts of a semiconductor device utilizing a sacrificial polysilicon fill-in stud.

According to a first aspect of the invention, a method of forming a semiconductor device, includes steps of: depositing a spacer dielectric film over a gate material; depositing a sacrificial polysilicon film over the spacer dielectric film; patterning the polysilicon film; depositing an oxide on the polysilicon film; planarizing the oxide; and removing the polysilicon film to form the semiconductor device.

According to a second aspect of the present invention, a method of forming a self-aligned, overlapping bitline contact, is provided which includes steps of: depositing a sacrificial polysilicon on a spacer dielectric film; patterning the polysilicon, the polysilicon film being a sacrificial fill-in for a bitline contact stud; depositing a middle-of-line (MOL) oxide on the polysilicon; planarizing the MOL oxide by chemical-mechanical polishing (CMP); etching the polysilicon; and etching the spacer dielectric film to form a self-aligned bitline contact.

The inventive method works with anisotropic, highly selective polysilicon:oxide etch to form a sacrificial polysilicon fill-in stud. After MOL oxide deposition and planarization, the stud is etched back and the contact hole is spacer etched. Finally, the contact hole is filled with polysilicon or another conductive layer (e.g., W).

Such processing minimizes the probability of wordline-bitline shorts and of bitline opens, thereby increasing the processing efficiency and reliability of the device.

To improve stress behavior and to lower the wordline-bitline capacity, oxide instead of nitride is preferably used as the spacer material.

Thus, with the invention, a disposable stud is formed before middle-of-line (MOL) oxide fill. Next, the MOL insulator is deposited and planarized to expose the stud. The stud is removed and final contact etching to the substrate is performed. Thereafter, the stud is refilled. With such a method according to the invention, selective $SiO_2$ to $Si_3N_4$ etching can be eliminated.

Further, the bitline contact is truly self-aligned. Each etch is relatively simple compared to the SiN etch stop process according to the conventional method. Thus, using a sacrificial polysilicon fill helps to control contact openings through the insulating spacer dielectric film layer.

Further, in the invention, silicon oxide is used as a spacer dielectric film and thus does not serves as a diffusion barrier for hydrogen ($H_2$), as does silicon nitride as in the conventional techniques. Therefore, hydrogen is able to saturate interface states and traps and the chip is more stable and has a higher data safety.

Further, silicon oxide used as a spacer dielectric film shows less mechanical stress than that of silicon nitride, thereby avoiding cracks and dislocations and preserving the stability of the chip and increasing the retention time.

Additionally, due to the relatively lower dielectric constant of silicon oxide (as compared to, for example, silicon nitride), the (parasitic) interlevel capacitance (Bitline-to-Bitline (BL—BL) and Bitline-to-Wordline (BL-WL)) is lowered for silicon oxide as compared to silicon nitride in the conventional techniques and structures.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
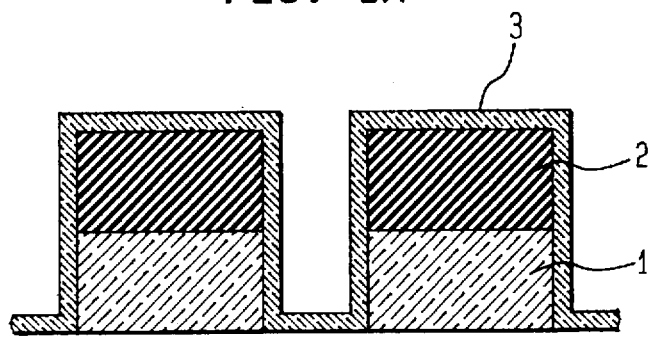
FIGS. 1(a)–1(i) are cross-sectional views of the process according to the present invention for forming a semiconductor device and more particularly for forming a self-aligned bitline contact with a sacrificial polysilicon fill-in stud.

Referring now to the drawings, and more particularly to FIGS. 1(a)–1(i), there is shown an embodiment according to the present invention. Prior to a detailed discussion of the invention, it is noted that while generally in the conventional methods bitline contacts are formed by first etching a hole into the MOL insulator and then etching a spacer liner, the inventive method first deposits a sacrificial polysilicon film.

As discussed below, this polysilicon film is patterned and acts as a sacrificial fill-in for the bitline contact stud. After patterning the sacrificial polysilicon stud, an MOL oxide is deposited and planarized. Thereafter, the sacrificial polysilicon is etched away and a blanket spacer etching is performed. At the conclusion of the inventive method, the self-aligned bitline contact can be deposited with a desired material (e.g., undoped or doped poly Si, W). The inventive method is described in detail below.

Turning to FIG. 1(a), the inventive method will be discussed in detail.

As shown in FIG. 1(a), the first step of the inventive process is depositing a spacer dielectric film 3 over a gate mask 2 having been previously deposited over a gate polysilicon 1. Spacer dielectric film 3 preferably is $SiO_2$, but alternatively, $Si_3N_4$ may be used instead of $SiO_2$. However, $SiO_2$ is the preferred material. The dielectric film 3 is preferably deposited by chemical vapor deposition (CVD).

The preferred thickness of the spacer dielectric film 3 lies between a range of substantially 10 nm to 40 nm (inclusive), with the most preferred thickness being approximately 20 nm. Typically, the thickness of the gate mask is approximately 100 nm to 200 nm and the thickness of the gate polysilicon 1 is approximately 100 nm to 200 nm.

The significance of such thicknesses in terms of operating characteristics is that the thinner both films are, the lower the parasitic capacitances (e.g., Bitline-to-Bitline and Bitline-to-Wordline). The thicker the polysilicon (and possibly in addition a metal silicide to form a "polycide") is, the faster the chip will be since the larger the wire area is, the lower the resistivity thereof will be, and thus the faster the wire.

Generally, polysilicon (and possibly in addition a metal silicide to form a "polycide") must be deposited first, the mask (preferably silicon oxide) has to be deposited second, and the spacer dielectric film has to be deposited third. The gate poly (silicon) 1 designed to be deposited on a gate oxide to form a metal oxide semiconductor (MOS) transistor.

Figure 1B:
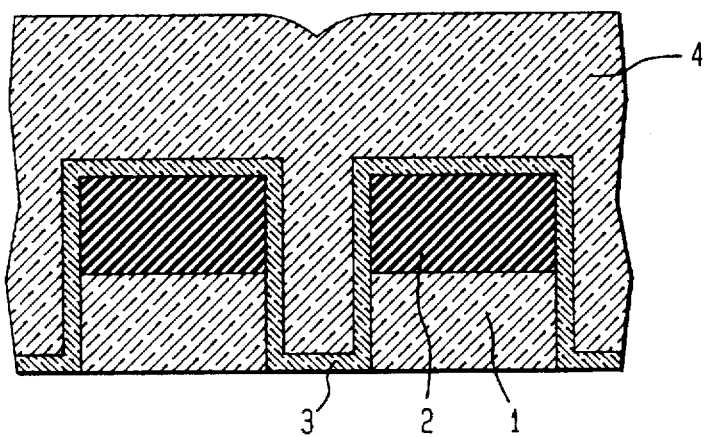

FIG. 1(b) illustrates the second step of the process in which the sacrificial polysilicon layer 4 is deposited (preferably by low-pressure chemical vapor deposition (LPCVD)) on the spacer dielectric film 3. The preferred thickness of the polysilicon film 4 is approximately 400 nm.

Figure 1C:
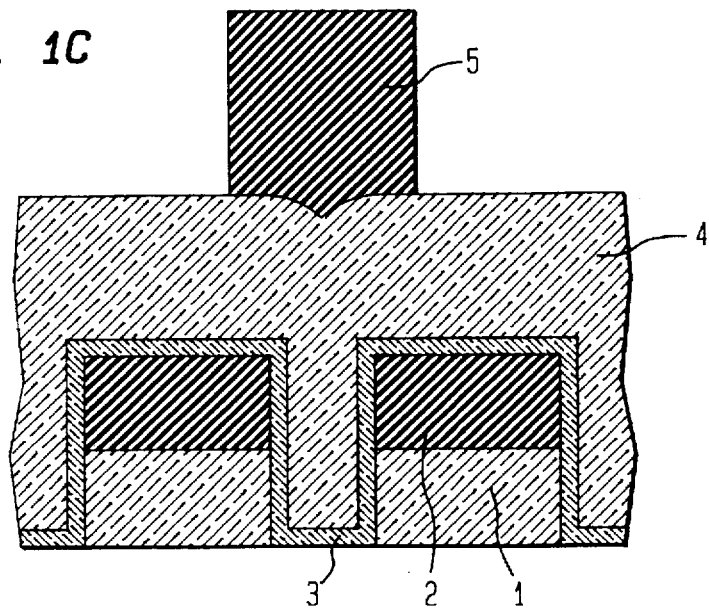

As shown in FIG. 1(c), the polysilicon film 4 is patterned. The film 4 serves as a sacrificial fill-in for the bitline contact stud. The patterning is preferably performed by known contact lithography techniques, according to the designer's requirements and constraints.

For example, in FIG. 1(c), patterning is performed by first depositing a photoresist 5. The photoresist may be of DUV type or the like, photosensitive polyimide or the like. Preferably, the resolution of the mask should be as low as possible, as is known.

Figure 1D:
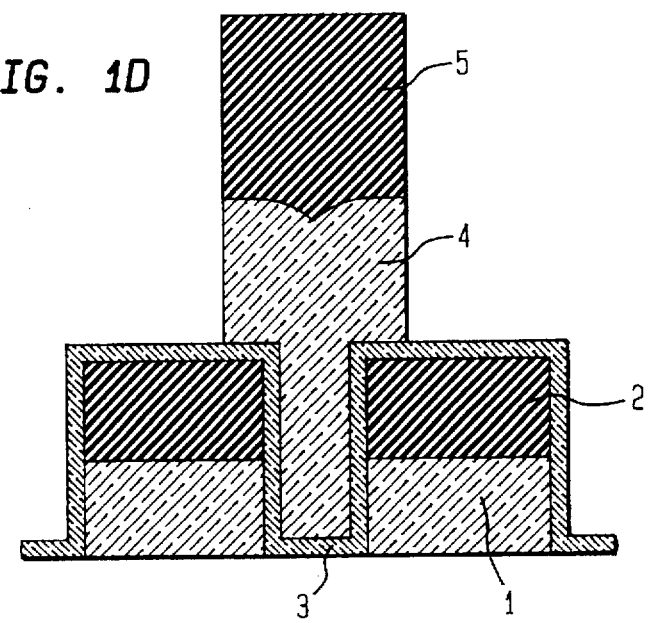

After deposition of the photoresist 5, a contact etching of the sacrificial polysilicon film 4 is performed, as shown in FIG. 1(d), such that the entire sacrificial polysilicon film 4 is etched back with the exception of the portion of polysilicon film 4 having the photoresist 5 thereover.

Figure 1E:
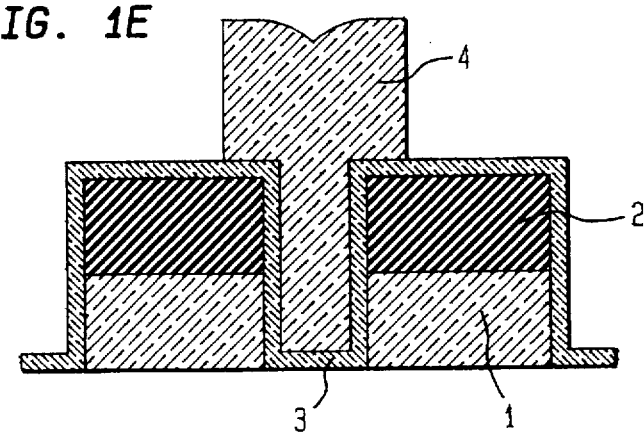

After the patterning the sacrificial polysilicon film 4, the photoresist 5 is stripped off by any suitable method, as shown in FIG. 1(e). Thus, the patterned polysilicon film 4 remains.

Figure 1F:
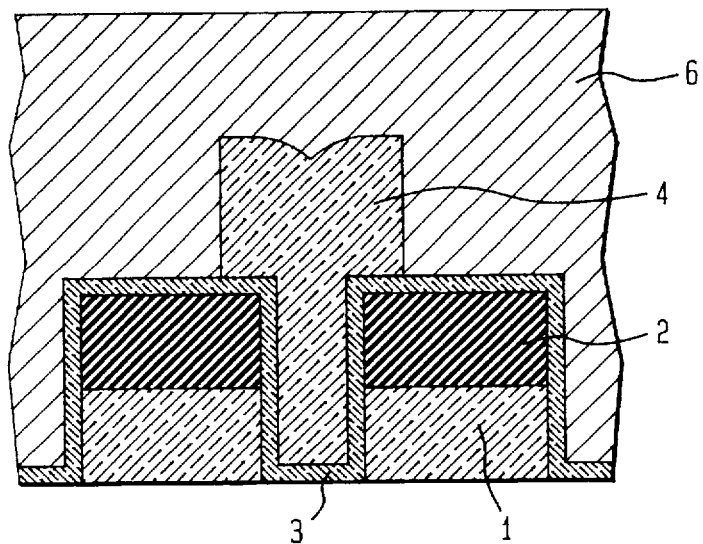

As shown in FIG. 1(f), a middle-of-line oxide layer (MOL) 6, is deposited over the entire structure including the sacrificial polysilicon film 4 and the spacer dielectric film 3. The MOL oxide serves as an isolation oxide and preferably has a thickness of several hundreds of nm (e.g., preferably 200–400 nm). The MOL oxide can be doped or undoped and can be deposited with silane-based ($SiH_4$) or TEOS-based chemistry. Preferably, the MOL oxide 6 is deposited doped based on TEOS chemistry.

Figure 1G:
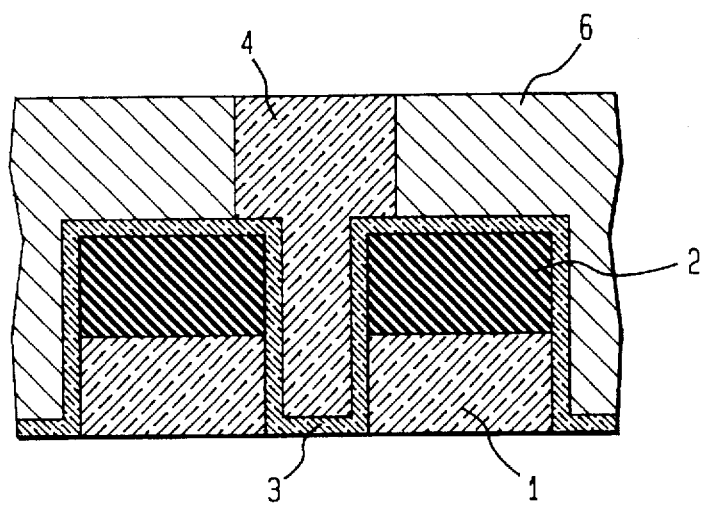

Referring to FIG. 1(g), the MOL oxide layer 6 is planarized by suitable methods such that the thickness of the MOL oxide is several hundreds of nm (e.g., preferably 200 nm to 400 nm). The thickness of the sacrificial film 4 protruding above the gate mask 2, is significant in that the thinner the sacrificial film 4 is, the higher the (parasitic) interlevel capacitances will be. However, the thinner film 5 is, the easier it is to fill in the bitline contact afterwards (e.g., lower aspect ratio for deposition). The preferred method of planarizing is by chemical-mechanical polishing (CMP). However, other planarizing methods may also be employed including deposition-etching-deposition sequence techniques.

Figure 1H:
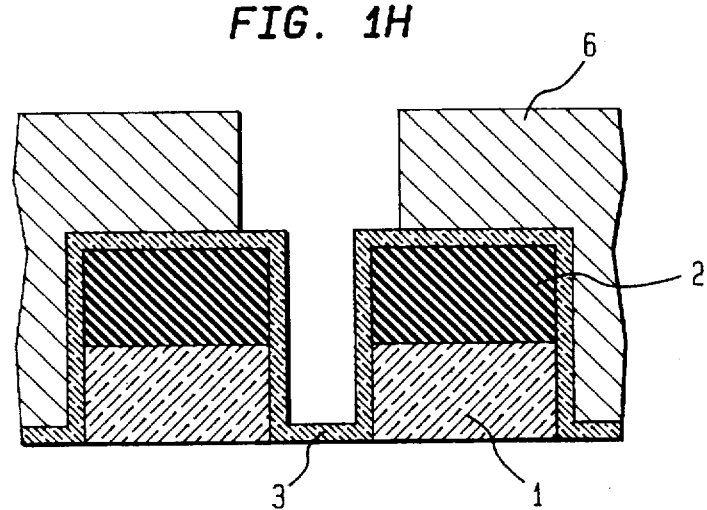

Thereafter, as shown in FIG. 1(h), the sacrificial polysilicon film 4 is etched away. The preferred method of etching is isotropic etch (wet or CDE). The advantage of such an isotropic etching is the relatively high selectivity of poly:oxide.

Figure 1I:
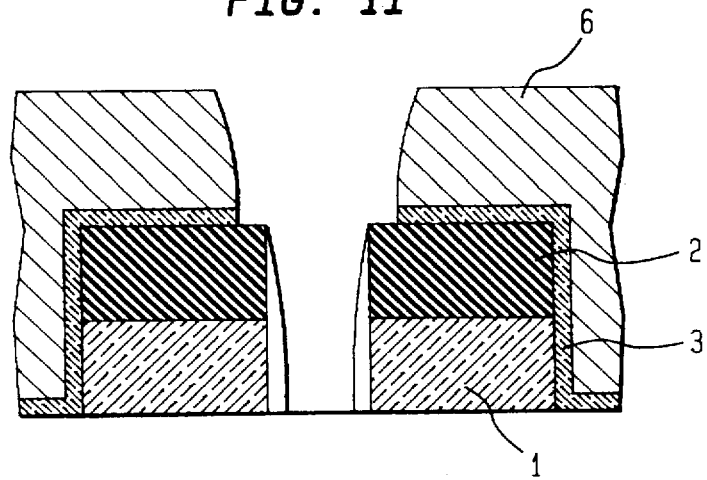

Finally, in FIG. 1(i), a blanket etching of the spacer dielectric film 3 is performed, leading to formation of gate sidewall spacers.

At the conclusion of the inventive method, the self-aligned bitline contact can be deposited into the contact holes with a desired material (e.g., undoped or doped polysilicon, W).

As mentioned above, as an alternative embodiment, the spacer dielectric film 3 may be formed of $Si_3N_4$ instead of $SiO_2$. However, $SiO_2$ is the preferred material.

Specifically, using $SiO_2$ instead of $Si_3N_4$ as a spacer liner lowers the wordline-bitline capacity which leads to improved data safety. Due to the relatively higher dielectric constant of silicon nitride as compared to silicon oxide, the (parasitic) interlevel capacitance (Bitline to Bitline (BL-BL) and Bitline to Wordline (BL-WL)) is higher for silicon nitride, as compared to silicon oxide.

Thus, silicon oxide is preferably used since, as mentioned above, silicon nitride ($Si_3N_4$) used as a spacer dielectric film acts as a diffusion barrier for hydrogen ($H_2$). Hydrogen is useful for saturating interface states and traps. If these interface states are saturated, the chip is more stable and has a higher data safety. Thus, a diffusion barrier as provided by the silicon nitride is disadvantageous. Further, silicon nitride ($Si_3N_4$) used as a spacer dielectric film shows higher mechanical stress. This higher mechanical stress leads to cracks and dislocations. Dislocations make the chip less stable, and the retention time is decreased.

Thus, using $SiO_2$ also lowers the surface stress which reduces dislocation formation and therefore increases the retention time. Indeed, silicon nitride used as a spacer dielectric film shows higher mechanical stress as compared to silicon oxide due to crystallographic reasons and the expansion coefficient ratio to polysilicon. This higher mechanical stress leads to cracks and dislocations.

Other advantages of the invention include less wordline-bitline shorts and less bitline opens which lead to a wider process window and greater processing efficiency and yield. Additionally, RIE processes can be performed with conventional tools. No high density plasma tools are necessary and thus an efficient, less complex process results with the invention.

Further, with the invention, the thickness of the gate mask can be reduced (for example, by one-half to lower the (parasitic) BL-WL and BL-BL capacitances), as compared to the conventional methods, which in turn reduces the process times and device heights. Yet another advantage of the invention is that, during the spacer etch, the substrate is exposed to the plasma only at the areas of the bitline contacts.

With the invention, a much more stable process sequence is provided and the CMP and sacrificial stud removal (which allows very selective wet etch conditions), along with the steps of spacer formation and contact polysilicon deposition, are much easier to control than conventional processes which use, for example, polysilicon etch back processes which use highly selective oxide to nitride etch conditions (wet etch leads to undercutting, while dry etch leads to insufficient selectivity or etch stop at small features).

Other advantages of the invention include lower dielectric constants leading to lower parasitic capacitances (BL-BL and BL-WL). Therefore, trenches can be etched significantly shallower, which would result in less expensive and less critical trench etches for further generation DRAMs. Alternatively, the trench depth may stay deep, but retention time (and thus data safety) is much improved.

Additionally, lower mechanical stress leads to less cracks and less dislocations, thereby resulting in higher retention times and higher data safety.

Another advantage of the invention is that higher hydrogen diffusivity results, making it easier to saturate interface states and traps. Thus, retention time and data safety are again enhanced.

While the invention has been described in terms of preferred embodiments, those skilled in the art will recognize that the invention can be practiced with modification within the spirit and scope of the appended claims.

Thus, in addition to the deposit and etch back process described above, a selective growth method or an epitaxial growth method also could be used to form such a structure.

Having thus described our invention, what we claim as new and desire to secure by Letters Patent is as follows:

1. A method of forming a semiconductor device, comprising steps of:

depositing a spacer dielectric film over a gate material;

depositing a sacrificial polysilicon film over said spacer dielectric film;

patterning said polysilicon film;

depositing an oxide on said polysilicon film;

planarizing said oxide by chemical mechanical polishing (CMP); and removing said polysilicon film by isotropic etching to form said semiconductor device.

2. A method according to claim 1, wherein said step of etching include at least one of a wet etching step and a dry etching step.

3. A method according to claim 1, wherein said spacer dielectric film comprises $SiO_2$.

4. A method according to claim 1, wherein said spacer dielectric film has a thickness between a range of 10 nm and 40 nm.

5. A method according to claim 4, wherein said spacer dielectric film has a thickness of approximately 20 nm.

6. A method according to claim 1, wherein said step of depositing said spacer dielectric film comprises a step of depositing said spacer dielectric film by chemical vapor deposition (CVD).

7. A method according to claim 1, wherein said gate material comprises a gate mask deposited over a gate polysilicon layer, said gate mask having a thickness in a range of approximately 100 nm to approximately 200 nm and said gate polysilicon layer having a thickness in a range of approximately 100 nm to approximately 200 nm.

8. A method according to claim 1, wherein said step of depositing said sacrificial polysilicon film comprises depositing, by low-pressure chemical vapor deposition (LPCVD), said sacrificial polysilicon film.

9. A method according to claim 1, wherein said step of planarizing said oxide comprises a step of isotropic etching said oxide.

10. A method according to claim 1, further comprising etching said spacer dielectric film to form a self-aligned bitline contact; and depositing said self-aligned bitline contact.

11. A method of forming a self-aligned overlapping bitline contact, comprising steps of:

depositing a sacrificial material on a film;

patterning said material, said material being a sacrificial fill-in for a bitline contact stud;

depositing an oxide on said material;

planarizing said oxide by chemical-mechanical polishing (CMP); and isotropically etching said material and said film to form a self-aligned bitline contact.

12. A method according to claim 11, wherein said material comprises polysilicon and said film comprises a spacer dielectric film.

13. A method according to claim 12, wherein said step of isotropically etching includes at least one of a wet etching step and a dry etching step.

14. A method according to claim 12, wherein said spacer dielectric film comprises one of $SiO_2$ and $Si_3N_4$.

15. A method according to claim 12, wherein said spacer dielectric film has a thickness between a range of 10 nm and 40 nm.

16. A method according to claim 15, wherein said spacer dielectric film has a thickness of approximately 20 nm.

17. A product formed by a process comprising steps of:

depositing a sacrificial material on a film;

patterning said material, said material being a sacrificial fill-in for a bitline contact stud;

depositing an oxide on said material;

planarizing said oxide by chemical-mechanical polishing (CMP);

isotropically etching said material; and etching said film to form a self-aligned bitline contact.

* * * * *